United States Patent
Igeta

(10) Patent No.: US 11,075,205 B2
(45) Date of Patent: Jul. 27, 2021

(54) APPARATUSES INCLUDING CONDUCTIVE STRUCTURES AND LAYOUTS THEREOF

(71) Applicant: MICRON TECHNOLOGY, INC., Boise, ID (US)

(72) Inventor: Masahiko Igeta, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 29 days.

(21) Appl. No.: 16/528,077

(22) Filed: Jul. 31, 2019

(65) Prior Publication Data
US 2021/0035985 A1 Feb. 4, 2021

(51) Int. Cl.
*H01L 27/108* (2006.01)
*G11C 11/4074* (2006.01)

(52) U.S. Cl.
CPC .... *H01L 27/10897* (2013.01); *G11C 11/4074* (2013.01)

(58) Field of Classification Search
CPC ......... H01L 27/10897; H01L 27/76802; H01L 23/5223; H01L 23/5226; G11C 11/4074
See application file for complete search history.

(56) References Cited

U.S. PATENT DOCUMENTS

2017/0318627 A1* 11/2017 Won ........................ F27D 7/06
2019/0157198 A1* 5/2019 Lee ........................ H01L 28/91

* cited by examiner

*Primary Examiner* — Phuc T Dang
(74) *Attorney, Agent, or Firm* — Dorsey & Whitney LLP

(57) ABSTRACT

Embodiments of the disclosure are drawn to arrangements of one or more conductive structures to provide connections to circuits or portions thereof located in different regions of a device. One or more of the conductive structures may include extensions and recesses. The extensions and recesses of different conductive structures may be complementary. That is, the extensions of one conductive structure may extend into a recess of another conductive structure.

19 Claims, 7 Drawing Sheets

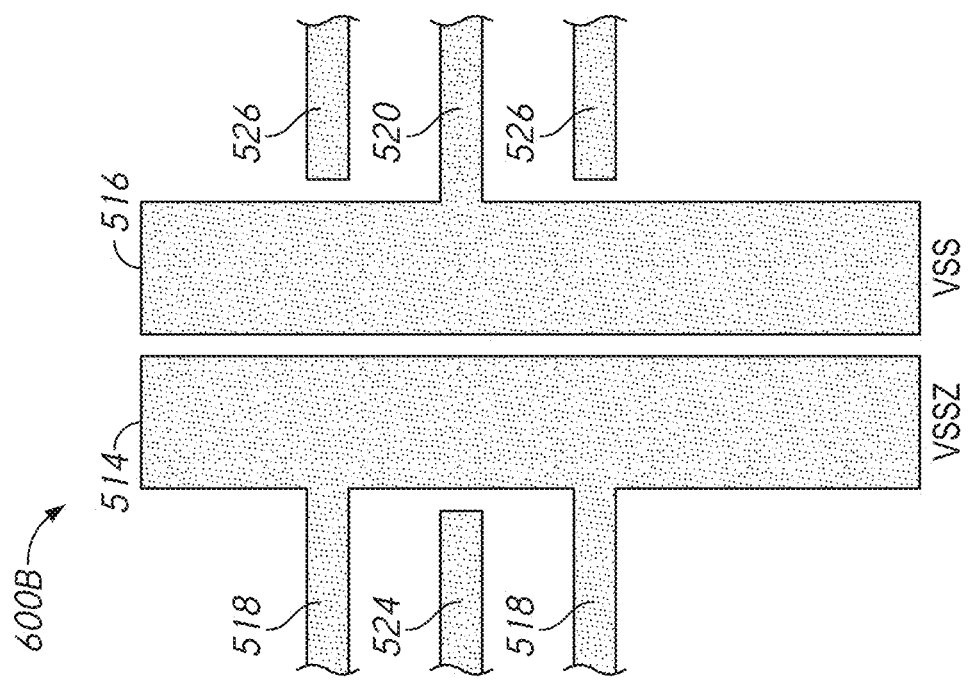
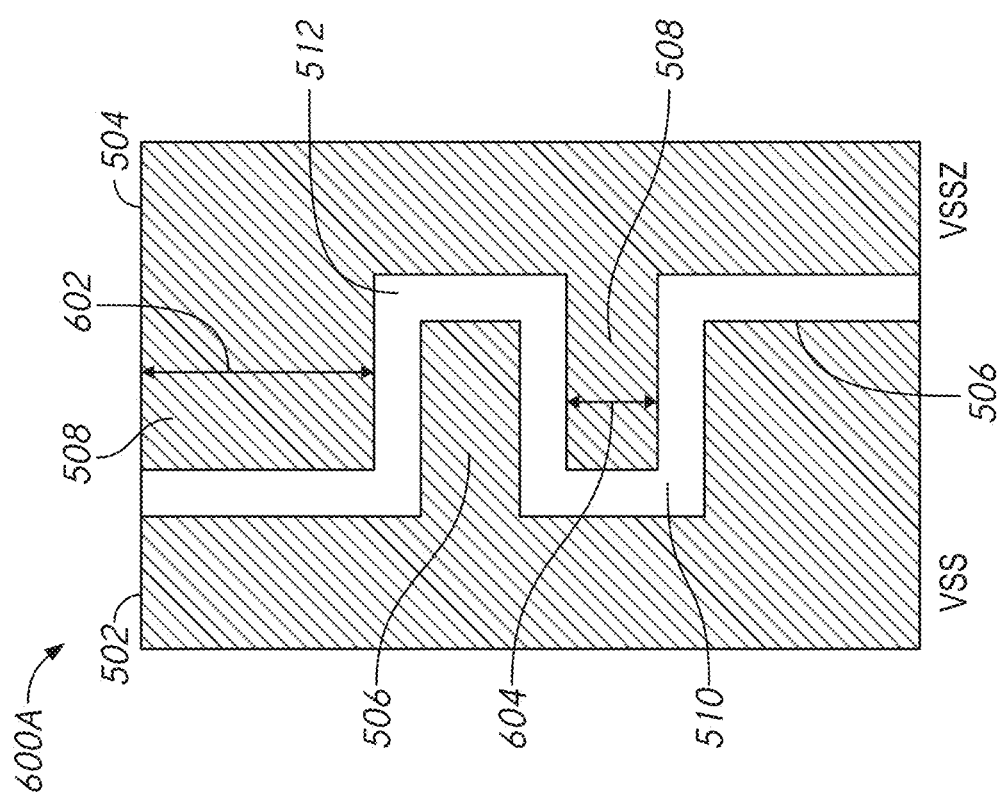
FIG. 6A
FIG. 6B

APPARATUSES INCLUDING CONDUCTIVE STRUCTURES AND LAYOUTS THEREOF

BACKGROUND

This disclosure relates generally to conductive structures (e.g., wires, wiring layers), and more specifically, to conductive structures in semiconductor devices. For example, conductive structures may be used in memory devices, including volatile memory, such as dynamic random access memory (DRAM). Data may be stored in individual memory cells of the DRAM. The memory cells may be organized in an array of rows and columns. Each memory cell in a row may be coupled to a word line and each memory cell in a column may be coupled to a bit line. Thus, every memory cell is coupled to a word line and a bit line.

Logic circuits peripheral to the memory array may control various memory functions, for example, accessing one or more memory cells of the memory array to read data from or write data to the memory cells. These logic circuits may be coupled to one or more voltage sources and/or ground by one or more conductive structures.

BRIEF DESCRIPTION OF THE DRAWINGS

FIG. 6A is a layout diagram of a first wiring layer of the power rail shown in FIG. 5 according to an embodiment of the disclosure.

FIG. 6B is a layout diagram of a second wiring layer of the power rail shown in FIG. 5 according to an embodiment of the disclosure.

DETAILED DESCRIPTION

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Conductive structures may be used in a variety of devices, such as controllers and memory devices. For example, conductive structures may be used to couple one or more components of a circuit to a voltage source and/or ground. As the size of devices, such as semiconductor devices, continue to be reduced, more efficient layouts (e.g., reduced layout area) of conductive structures that can effectively provide coupling of circuit components is desired. For purposes of illustration, reference will be made to conductive structures used in the peripheral circuits of a semiconductor device including DRAM. However, the configurable logic circuits described herein are not limited to this specific application. For example, the configurable logic circuits may be included in other memory types (e.g., FeRAM, STT-RAM, etc.) and/or other devices (e.g., controllers, processors).

Figure 1:
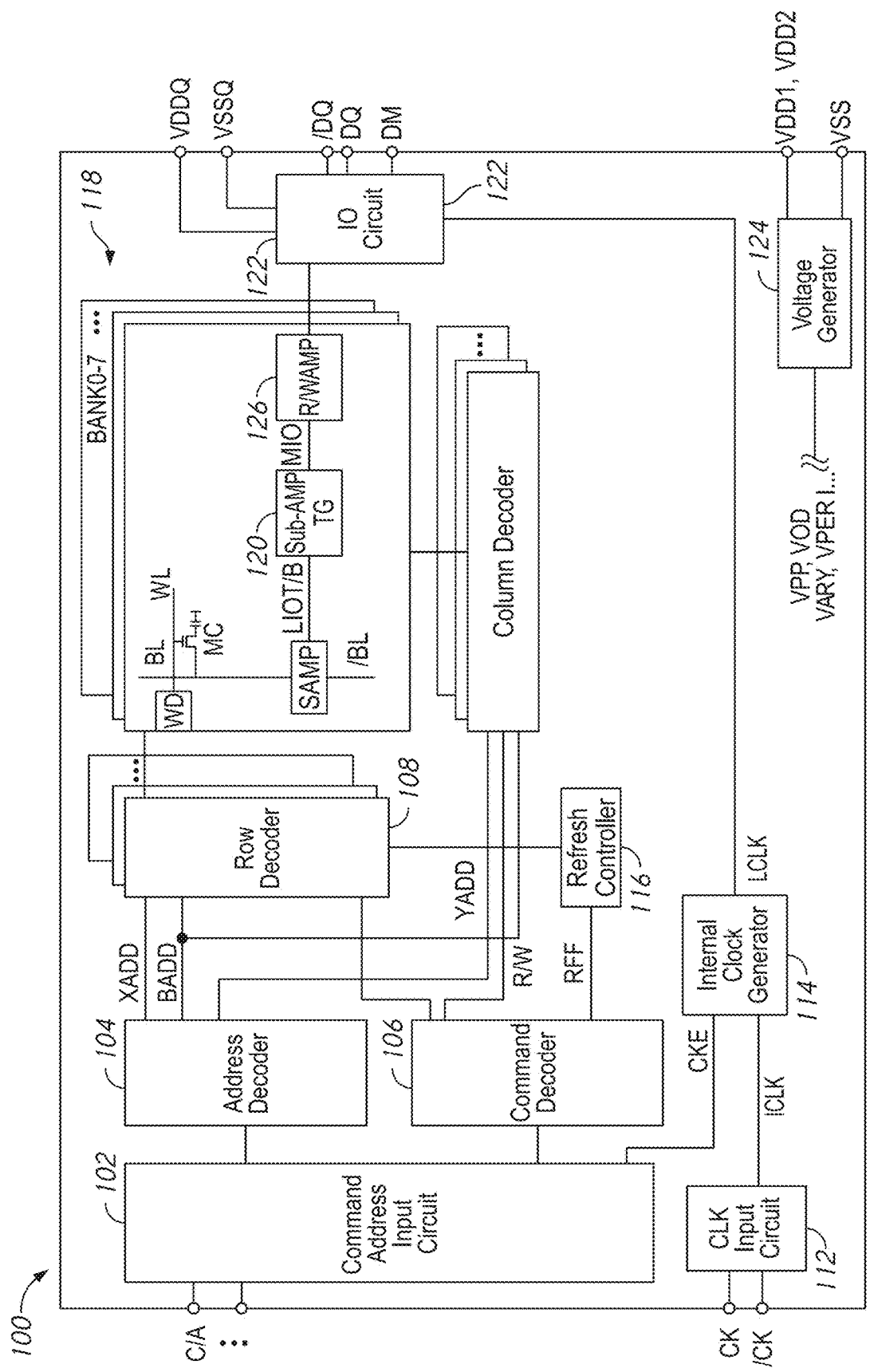
FIG. 1 is a block diagram of a semiconductor device according to an embodiment of the present disclosure.

FIG. 1 is a block diagram showing an overall configuration of a semiconductor device 100 according to at least one embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 in other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. A selected word line WL may be driven to a desired charge by word line driver WD. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP).

Read data from the bit line BL or /BL is amplified by the sense amplifier SAMP, and provided to sub-amplifier transfer gate 120 over complementary local data lines (LIOT/B). The sub-amplifier transfer gate 120 may act as a switch to form a conductive path between the appropriate LIOT/B and appropriate shared main data lines (MIO). Read data may pass from the local data lines LIOT/B to the main data lines MIO via a conductive path provided by the sub-amplifier transfer gate 120 to a read amplifier 126, which provides the data to an IO circuit 122. Write data received from IO circuit 122 is output from a write amplifier 126 and provided to the sense amplifier SAMP over the complementary main data lines MIO, the sub-amp transfer gate 120, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD1, VDD2, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are provided, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line WL and a column command signal to select a bit line BL.

The device 100 may receive an access command which is a read command. When an activation command is received, and row and bank addresses are timely supplied with the activation command, followed by a read command and a column address is timely supplied with the read command, read data is read from memory cells MC in the memory array 118 corresponding to the row address and column address. The read command is received by the command decoder 106 (e.g., command controller), which provides internal commands so that read data from the memory array 218 is provided to the read amplifier 128. The read data is output to outside from the data terminals DQ via the input/output circuit 122.

The device 100 may receive an access command which is a write command. When an activation command is received, and row and bank addresses are timely supplied with the activation command, followed by a write command and a column address is timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the write amplifier 126, and by the write amplifier 126 to the memory array 118 to be written into the memory cell MC.

The device 100 may also receive commands causing it to carry out a refresh operation. The refresh signal may be a pulse signal which is activated when the command decoder 106 receives a signal which indicates an auto-refresh and/or other refresh command. In some embodiments, the refresh command may be externally issued to the memory device 100. In some embodiments, the refresh command may be periodically generated by a component of the device 100. The refresh signal is provided to the refresh controller 116. A refresh command provided to the refresh controller 116 may cause the device 100 to carry out refresh operations for one or more of the memory banks.

Power supply terminals of device 100 are supplied with power supply potentials VDD1, VDD2, and VSS. The power supply potentials VDD1, VDD2, and VSS are supplied to an internal voltage generator circuit 124. The internal voltage generator circuit 124 generates various internal potentials VPP, VOD, VARY, VPERI, and the like based on the power supply potentials VDD1, VDD2, and VSS supplied to the power supply terminals. While the various internal potentials and power supply potentials may be used for any of the different circuits of the device 100, the internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

One or more of the circuits previously described that are peripheral to the memory array 118, for example, decoders, controllers, etc. may be included in the semiconductor device 100 as peripheral circuitry.

Figure 2:
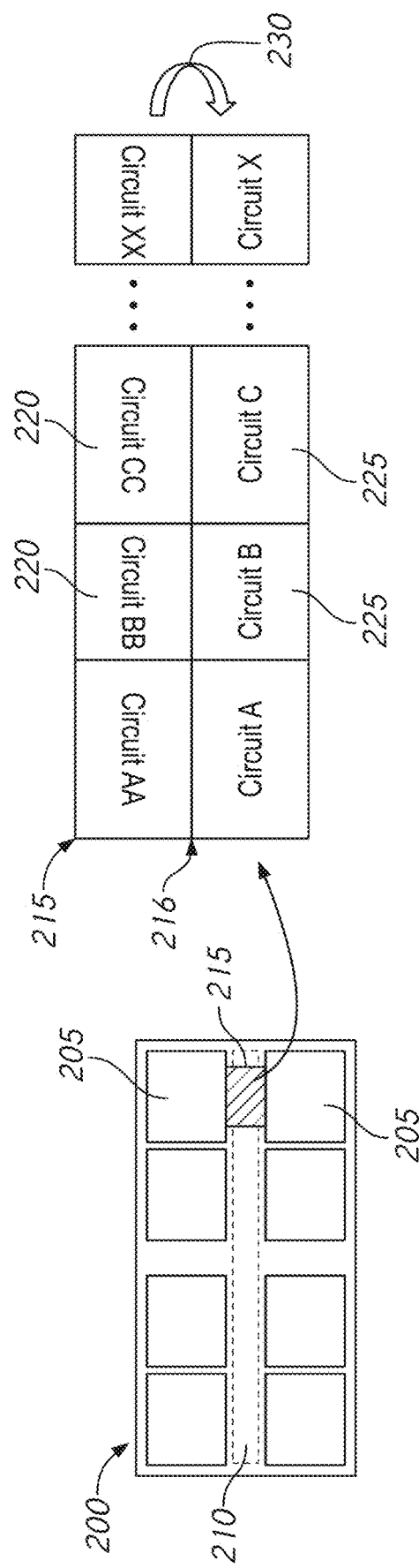
FIG. 2 is a block diagram of a layout for a semiconductor device according to an embodiment of the present disclosure.

FIG. 2 is a block diagram of a layout for a semiconductor device 200 according to an embodiment of the present disclosure. In some embodiments, the layout for the device 200 may be used for device 100 or a portion of device 100 shown in FIG. 1. The device 200 may include one or more memory subarrays 205 (e.g., banks of memory). The device 200 may include a peripheral region 210, located peripheral to the memory subarrays 205. The peripheral region 210 may include peripheral circuitry 215 coupled to one or more memory subarray 205. The peripheral circuitry 215 may include one or more circuits 220 and one or more corresponding circuits 225. In some embodiments, the circuits 225 may mirror the corresponding circuits 220 as indicated by arrow 230. For example, circuits 220 and circuits 225 may include the same or similar components that are arranged such that the circuits 220 and circuits 225 symmetrical or nearly symmetrical about an axis (e.g., axis 216 in the example shown in FIG. 2) of "reflection" to each other. In some embodiments, the circuits 220 may provide functionality for a memory subarray 205 and circuits 225 may provide functionality for a different memory subarray 205. In some embodiments of the disclosure, the peripheral region 210 include one or more of the circuits previously described with reference to FIG. 1, for example, decoders, controllers, etc. In some embodiments, as will be described in more detail below, the circuits 220 and circuits 225 may share a border region and/or one or more components. This may increase layout efficiency in some applications.

Figure 3:
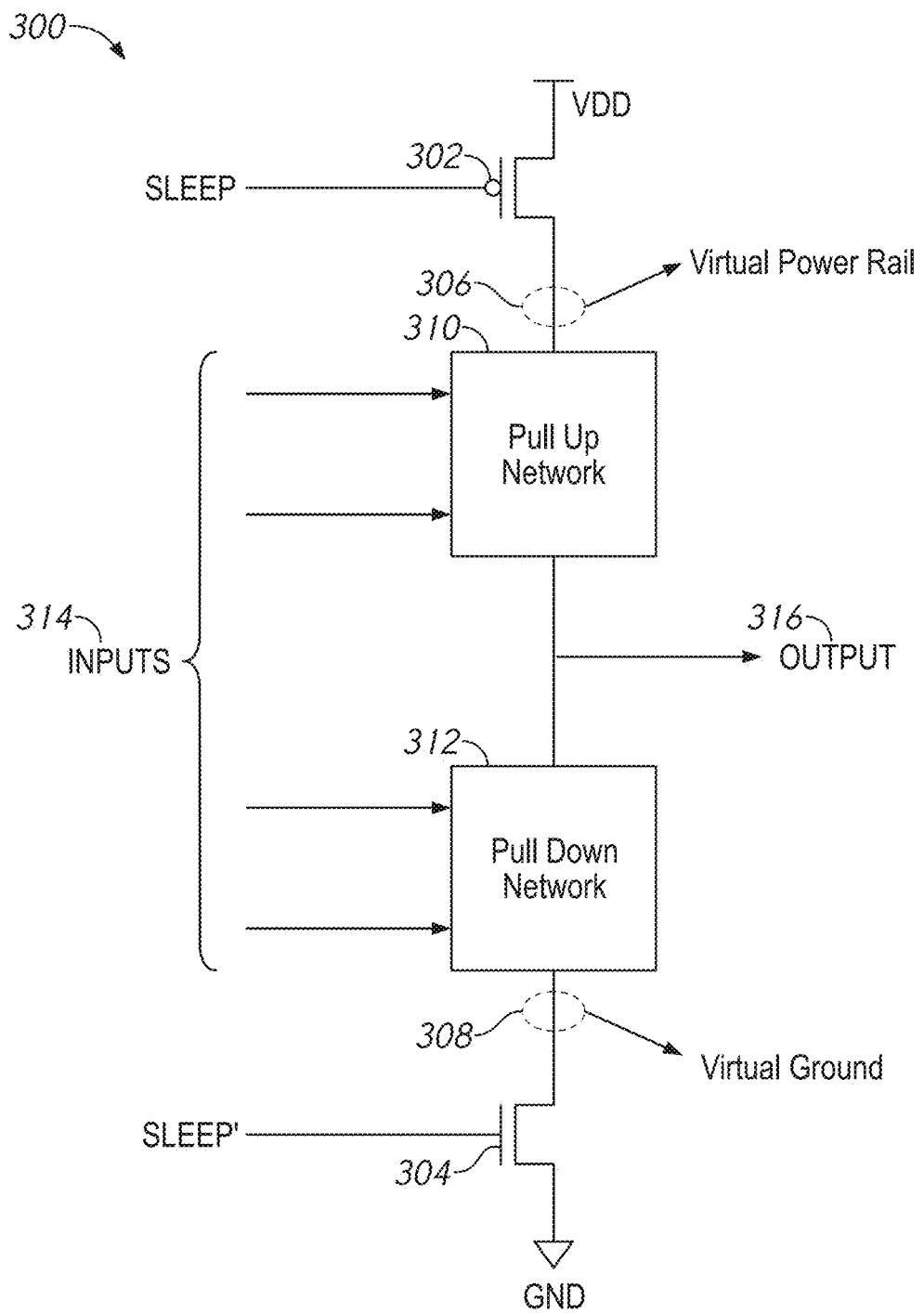
FIG. 3 is a block diagram of a power gated circuit according to an embodiment of the disclosure.

FIG. 3 is a block diagram of a power gated circuit 300 according to an embodiment of the disclosure. Power gating may be used to reduce power consumption of circuits in some applications. The power gated circuit 300 may include a first power gating transistor 302 coupled between a voltage source VDD (which may be VDD1, VDD2, VDDQ or based, at least in part on VDD1, VDD2, and/or VDDQ shown in FIG. 1 in some embodiments) and a pull-up network 310. The power gated circuit 300 may further include a second power gating transistor 304 coupled between ground GND (which may be VSS or VSSQ or based, at least in part on VSS and/or VSSQ shown in FIG. 1 in some embodiments) and a pull down network 312. In some embodiments, the pull up network 310 and/or pull down network 312 may be included in a peripheral circuit, such as the peripheral circuits 220, 225 shown in FIG. 2. The pull up network 310 and pull down network 312 may be controlled by inputs 314 to provide output 316. The gates of the first power gating transistor 302 and the second power gating transistor 304 may receive signals SLEEP and SLEEP', respectively.

During operation, the first gating transistor 302 and second gating transistor 304 are active to provide VDD and GND to the pull up network 310 and pull down network 312, respectively. However, when the pull up network 310 and pull down network 312 are not needed (e.g., the portion of the circuit including the pull up network 310 and pull down network 312 is not selected), the first gating transistor 302 and second gating transistor 304 are inactive. This may disconnect the pull up network 310 and pull down network 312 from receiving VDD and GND, which may reduce a leakage current between VDD and GND. The reduction in leakage current may reduce power consumption of the device.

In some embodiments, there may be a virtual power rail (not shown) coupled at a region 306 between the first gating transistor 302 and the pull up network 310. In some embodiments, there may be a virtual ground (not shown) coupled at a region 308 between the second gating transistor 304 and the pull down network 312. The virtual power rail may be shared amongst multiple circuits. Likewise, the virtual ground may be shared amongst multiple circuits as well. For example, the virtual power rail and/or virtual ground may be shared amongst circuits 220 and/or circuits 225 in peripheral circuitry 215 shown in FIG. 2 in some embodiments. Sharing the virtual power rail amongst multiple circuits in an area-efficient manner is desired.

Figure 4:
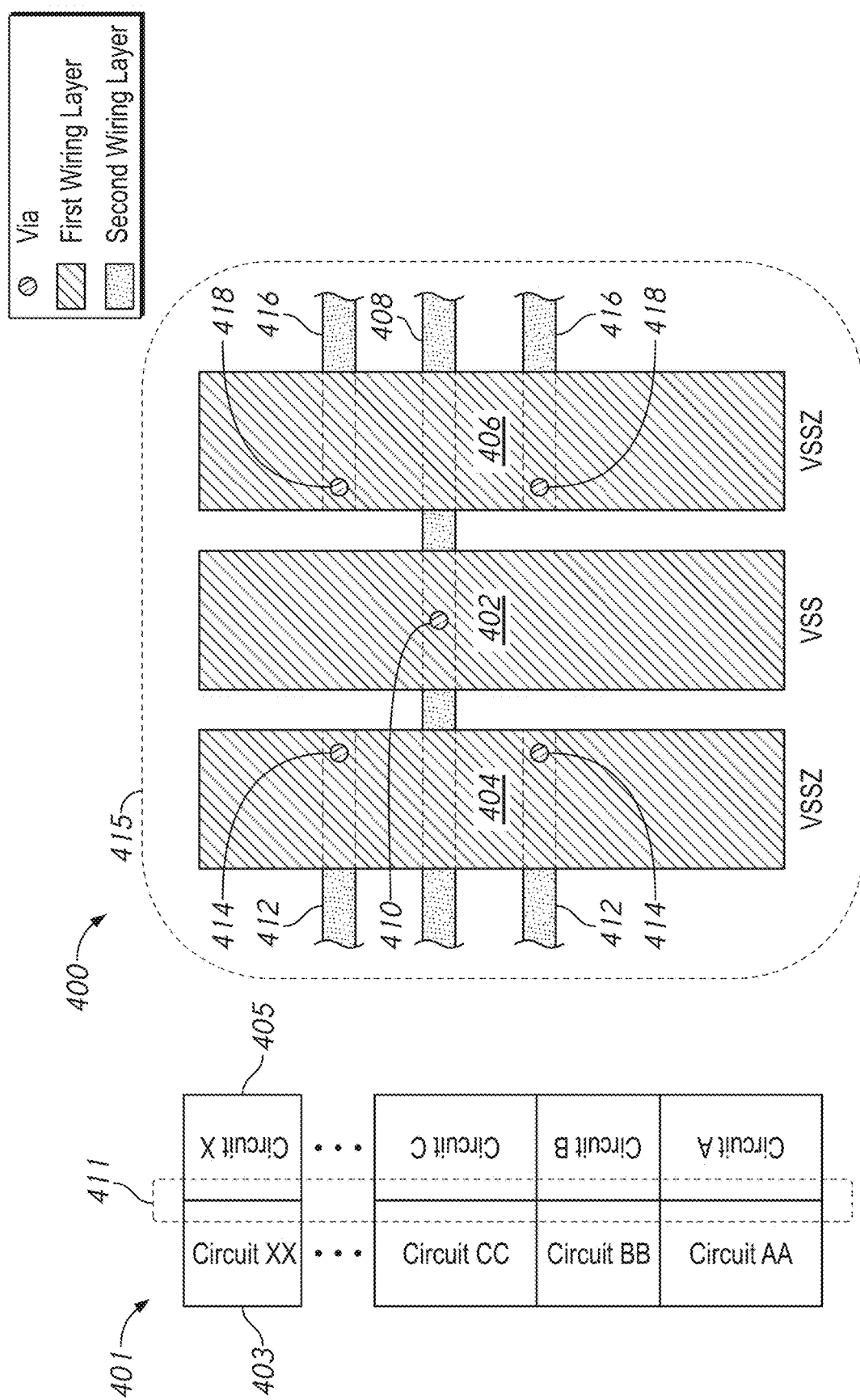
FIG. 4 is a layout diagram of a portion of a power rail.

FIG. 4 is a layout diagram of a portion of a power rail 400, which may be a virtual power rail in some examples. For context, peripheral circuitry 401 is also shown. As indicated by the box 411, power rail 400 may extend between the circuits 403, 405 of peripheral circuitry 401. That is, both a circuit 403 and its corresponding circuit 405 of the peripheral circuitry 401 may be coupled to the power rail 400. The power rail 400 may provide one or more voltages to one or more circuits, such as the circuits 403 and 405 of peripheral circuitry 401. In some embodiments of the disclosure, the circuits 403 and 405 are mirrored as described with reference to circuits 220 and 225 in FIG. 2.

Box 415 shows an exemplary portion of the power rail 400. The power rail 400 may include a conductive structure 402 for providing the circuits 403, 405 with a voltage VSS. The voltage VSS may be provided by an additional conductive structure 408 and a conductive via 410. The additional conductive structure 408 may be a different layer (e.g., wiring layer) from the conductive structure 402 in some embodiments of the disclosure. The power rail 400 may include a conductive structure 404 adjacent to the conductive structure 402 for providing circuits 403 with a second voltage VSSZ, which may be a virtual voltage in some examples. The second voltage VSSZ may be provided by additional conductive structures 412 and conductive vias 414. The power rail 400 may further include a conductive structure 406 adjacent to the conductive structure 402 on a side opposite the conductive structure 404. The conductive structure 406 may provide VSSZ to circuits 405. The voltage VSSZ may be provided by additional conductive structures 416 and conductive vias 418. As noted, box 415 shows only an exemplary portion of the power rail 400. It is understood that conductive structures 402-406 may extend longitudinally in either direction and/or additional conductive structures 408, 412, 416 and/or conductive vias 410, 414, 418 may be coupled to the conductive structures 402-406 to provide the peripheral circuitry 401 with VSS and/or VSSZ.

While sharing of the power rail 400 between the circuits 403 and circuits 405 of peripheral circuitry 401 provides some layout efficiency, providing separate conductive structures 404 and 406 to provide the circuits 403 and circuits 405 with VSSZ is inefficient. Furthermore, the design of the power rail 400 may require a significant number of individual additional conductive structures 410, 412, 416. This may also increase layout area and/or complicate fabrication of a device including power rail 400.

Figure 5:
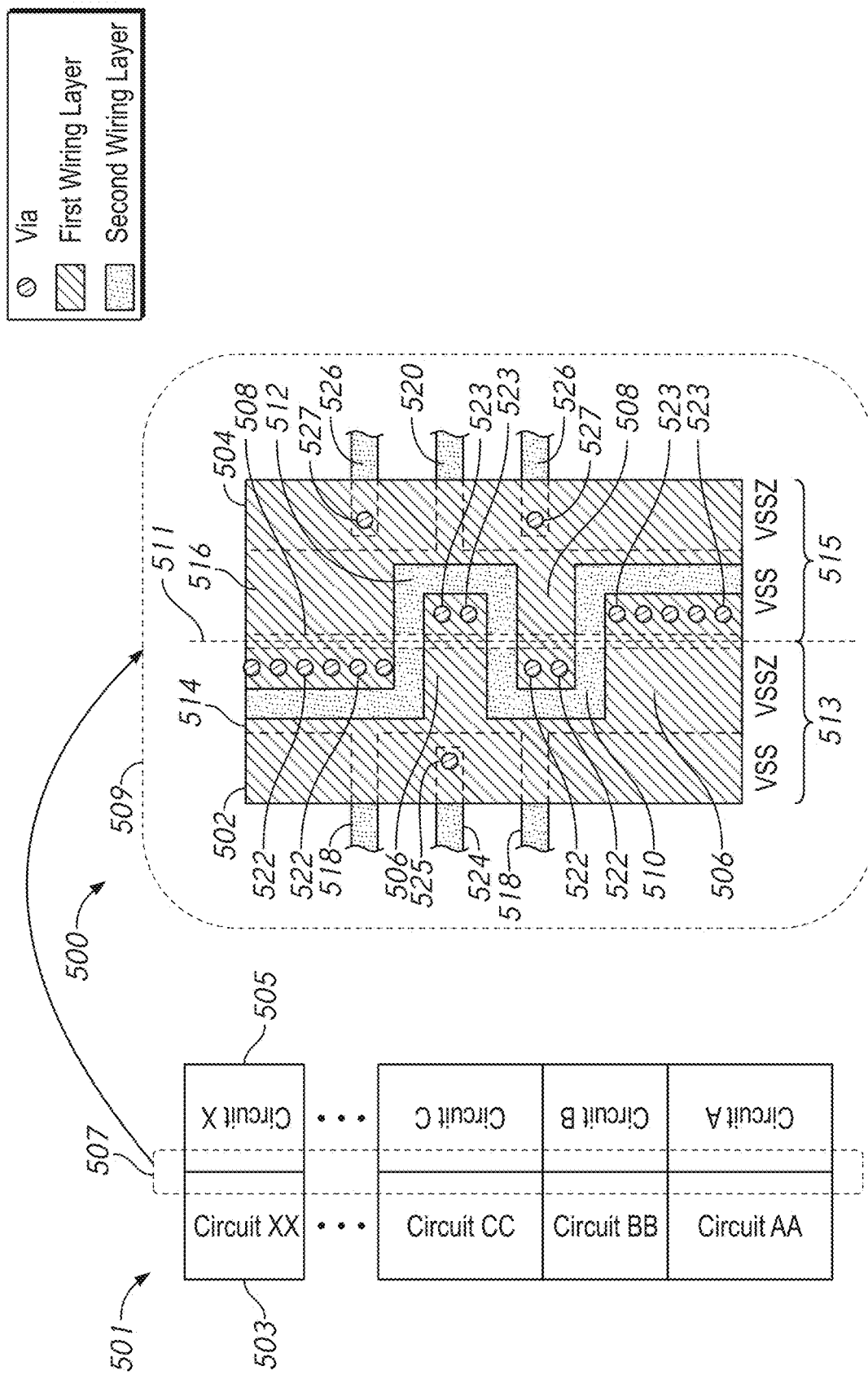
FIG. 5 is a layout diagram of a portion of a power rail according to an embodiment of the disclosure.

FIG. 5 is a layout diagram of a portion of a power rail 500 according to an embodiment of the disclosure. In some embodiments, the power rail 500 may be a virtual power rail. For example, in some embodiments, the power rail 500 may be used to implement a virtual power rail in power gated circuit 300 shown in FIG. 3. For context, peripheral circuitry 501 is also shown. As indicated by the box 507, power rail 500 may extend between the circuits 503, 505 of peripheral circuitry 501. In some examples, the circuit 503 may mirror circuit 505 and both may be coupled to the power rail 500. However, in other embodiments the power rail 500 may be coupled to other components or other circuit types, not just peripheral circuitry.

Box 509 shows an exemplary portion of the power rail 500. As mentioned, the power rail 500 may extend between the circuits 503, 505. More generally, the power rail 500 may extend between a first region 513 and a second region 515 (e.g., the power rail 500 includes portions in the first region 513 and the second region 515). A dashed line 511 indicates a boundary between the two regions 513 and 515. In some embodiments, the boundary may be physical (e.g., different diffusion regions). In some embodiments, the boundary may be spatial (e.g., a center line of the power rail and/or surrounding components).

In some embodiments, the power rail 500 may include a conductive structure 502 configured to provide a first voltage (e.g., VSS in the example shown in FIG. 5) and a conductive structure 504 configured to provide a second voltage (e.g., VSSZ in the example shown in FIG. 5). In some embodiments, the second voltage may be a virtual voltage, and the conductive structure 504 may only provide the second voltage when activated. For example, by a power gating transistor, such as power gating transistor 302 of FIG. 3.

The conductive structure 502 may extend along the first region 513 in a first dimension (vertically in the example shown in FIG. 5). The conductive structure 502 may include one or more extensions 506 that extend in a second dimension (horizontally in the example shown in FIG. 5) and extend into the second region 515. That is, the extensions 506 cross the boundary indicated by line 511 between the first region 513 and the second region 515.

The conductive structure 504 may extend along the second region 515 in a first dimension (vertically in the example shown in FIG. 5). However, similar to the conductive structure 502, the conductive structure 504 may include one or more extensions 508 that extend in a second dimension (horizontally in the example shown in FIG. 5) and extend into the first region 513. That is, the extensions 508 cross the boundary indicated by line 511 between the first region 513 and the second region 515.

The conductive structure 502 may include one or more recesses 510 that extend along the second dimension. The recesses 510 may be configured to accept the extensions 508. By accept, it is meant that the recesses 510 allow the extensions 508 to extend into the first region 513 without interfering (e.g., short circuit, parasitic coupling) with the conductive structure. Similarly, the conductive structure 504 may include one or more recesses 512 that extend in the second dimension and are configured to accept the extensions 506 of the conductive structure 502.

In some embodiments, the conductive structure 502 and conductive structure 504 may be included in a first wiring layer. In some embodiments, the conductive structure 502 and/or the conductive structure 504 may include a metal material, for example, aluminum. Other metal materials may be additionally or alternatively included in the conductive structures 502 and 504 in some embodiments of the disclosure. In some embodiments, the first voltage VSS and second voltage VSSZ may be provided to the conductive structure 502 and the conductive structure 504, respectively, by another wiring layer (not shown) coupled to the first wiring layer. In some embodiments, the wiring layer may provide the conductive structures with one or more voltage sources (e.g., internal voltage generator circuit 124 shown in FIG. 1).

In some embodiments, the power rail 500 may include a conductive structure 514 and a conductive structure 516. The conductive structure 514 may extend along the first region 513 in a first dimension (vertically in the example shown in FIG. 5). The conductive structure 514 may include one or more extensions 518 that extend in a second dimension (horizontally in the example shown in FIG. 5) in the first region 513. In some embodiments, the extensions 518 may couple to a circuit and/or other component in the first region 513 (e.g., circuit 503). The conductive structure 514 may be configured to provide a voltage from the second region 515. For example, the conductive structure 514 may be configured to provide voltage VSSZ to circuit 503. In some embodiments, the conductive structure 514 may be coupled to the conductive structure 504 in order to provide a voltage from the second region 515. In the embodiment shown in FIG. 5, the conductive structure 514 is coupled to the conductive structure 504 at the one or more extensions 508. In some embodiments, such as the one shown in FIG. 5, one or more vias 522 couple the conductive structure 514 to the conductive structure 504.

The conductive structure 516 may extend along the second region 515 in a first dimension. The conductive structure 516 may include one or more extensions 520 that extend in a second dimension in the second region 515. In some embodiments, the extensions 520 may couple to a circuit and/or other component in the second region 515 (e.g., circuit 505). The conductive structure 516 may be configured to provide a voltage from the first region 513. For example, the conductive structure 516 may be configured to provide voltage VSS to circuit 505. In some embodiments, the conductive structure 516 may be coupled to the conductive structure 502 in order to provide a voltage from the first region 513. In the embodiment shown in FIG. 5, the conductive structure 516 is coupled to the conductive structure 502 at the one or more extensions 506. In some embodiments, such as the one shown in FIG. 5, one or more vias 523 couple the conductive structure 516 to the conductive structure 502.

In some embodiments, such as the one shown in FIG. 5, the power rail 500 may include additional conductive structures 524 and 526. The additional conductive structures 524 may be coupled (e.g., by vias 525) to the conductive structure 502 to provide the voltage from the first region 513 (e.g., VSS) to a circuit and/or other components in the region 513. The additional conductive structures 526 may be coupled (e.g., by vias 527) to the conductive structure 504 to provide the voltage from the second region 515 (e.g., VSSZ) to a circuit and/or other components in the second region 515.

In some embodiments, the conductive structure 514 and conductive structure 516 may be included in a second wiring layer. In some embodiments, the second wiring layer may be below the first wiring layer. In some embodiments, the additional conductive structures 524, 526 may be included in the second wiring layer. In some embodiments, the conductive structure 514, the conductive structure 516, and/or the additional conductive structures 524, 526 may include a metal material, for example, tungsten. In some embodiments, the vias 522, 523, 525, and/or 527 may include a metal material, for example, tungsten.

It is understood that conductive structures 502, 504, 514, and 516 may extend longitudinally in either direction and/or more or fewer extensions and/or recesses may be included in the conductive structures than are shown in FIG. 5. Furthermore, more or fewer additional conductive structures 524, 526 408, 412, 416 and/or conductive vias 522, 523, 525, and/or 527 may be included in power rail 500.

The layout of power rail 500 may allow circuitry on either side of power rail 500 to be provided with voltages by conductive structure 502 and/or conductive structure 504 without an additional conductive structure to provide a voltage on either side, such as in power rail 400 shown in FIG. 4. Furthermore, as shown in FIG. 5, conductive structure 514 and conductive structure 516 may provide "global wiring" for coupling circuitry from the respective first region 513 and second region 515 to the conductive structure 504 and the conductive structure 502, respectively. This may reduce the number of individual additional conductive structures required, for example in comparison to the layout shown in FIG. 4, which may simplify fabrication in some applications.

FIGS. 6A and 6B are layout diagrams of a first wiring layer 600A and a second wiring layer 600B, respectively, of the power rail 500 according to an embodiment of the disclosure. As discussed previously, conductive structure 502 and conductive structure 504 may be included in the first wiring layer 600A in some embodiments. In some embodiments, conductive structure 514, conductive structure 516, and/or additional conductive structures 524, 526 may be included in second wiring layer 600B. The wiring layers 600A and 600B are shown separately in FIGS. 6A and 6B to provide views of the features of the conductive structures 502, 504, 514, and 516. However, the conductive structures 502, 504, 514, and 516 are not required to be included in the particular wiring layers shown in FIGS. 6A and 6B.

In the examples shown in FIGS. 5 and 6A, the extensions 506 and 508 have varying widths, for example, as indicated by arrows 602 and 604. However, in some embodiments, the extensions 506 and 508 may have uniform thicknesses. In the examples shown in FIGS. 5 and 6B, the extensions 518 and 520 are positioned such that they are not directly across from one another. However, extensions 518 and 520 have a corresponding additional conductive structure 526 and 524, respectively, positioned directly across. In other embodiments, the alignment between extensions 518 and 520 and with additional conductive structures 526 and 524 may be different. Furthermore, although extensions 518 are shown as alternating with additional conductive structures 524 and extensions 520 are shown as alternating with additional conductive structures 526, in other embodiments, the arrangement may be different. For example, there may be multiple extensions 518 adjacent to one another in some embodiments.

Figure 7:
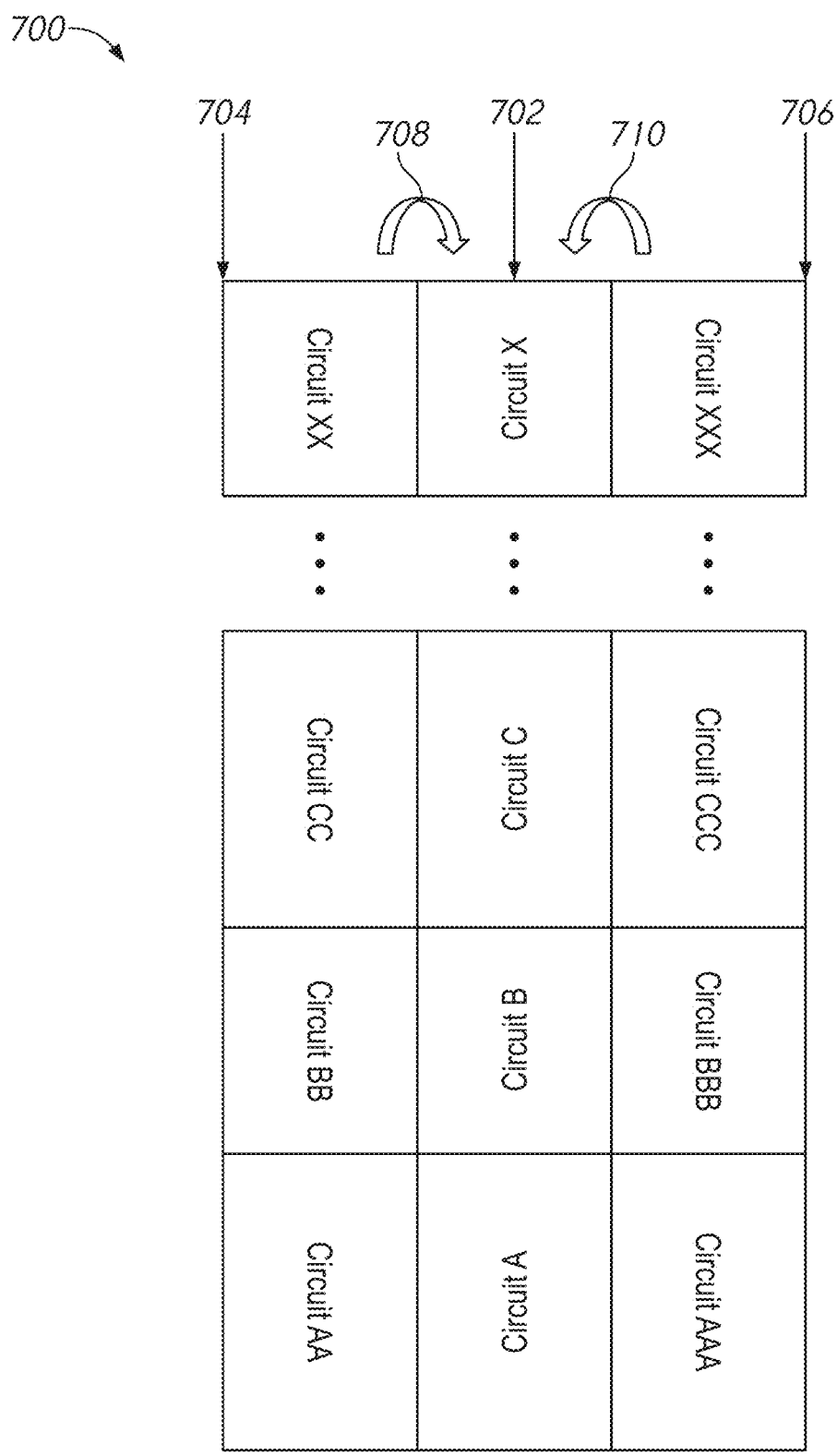
FIG. 7 is a block diagram of peripheral circuitry according to an embodiment of the disclosure.

FIG. 7 includes a block diagram of a peripheral circuitry 700 according to an embodiment of the disclosure. In some embodiments, the peripheral circuitry 700 may be included in peripheral circuitry 215 shown in FIG. 2. In some embodiments, peripheral circuitry 700 may include circuits 702. Peripheral circuitry 700 may include circuits 704 on a first side of circuits 702 and may further include circuits 706 on a second side of circuits 702. Circuits 704 may share a border region with circuits 702 and circuits 706 may also share a border region with circuits 702. As shown by arrows 708 and 710, in some embodiments, circuits 704 and/or circuits 706 may mirror the circuits 702.

In embodiments including peripheral circuitry 700, a power rail having a layout similar to the layout shown in FIGS. 5-7 may be used for providing one or more voltages to the circuits 702, 704, and 706, such as VSS and/or VSSZ. The power rail may further include additional conductive structures having a layout similar to that for providing VSS and/or VSSZ for providing one or more additional voltages such as VDD and/or VDDZ. In some embodiments, a separate power rail having a layout similar to the layout shown in FIGS. 5-7 may be used to provide VDD and/or VDDZ to circuits 702, 704, and 706.

Some embodiments of the disclosure may allow for a voltage from one region to be provided to a circuit or other component in another region with reduced layout area. For example, a power rail having a layout similar to the layout shown in FIG. 4 may have a width of 2.5 µm whereas a power rail having a layout similar to the layout shown in FIG. 5 may have a width of 1.58 µm in some embodiments. This example is provided only for illustrative purposes and the principles of the present disclosure are not limited to this particular example. Some embodiments of the disclosure may allow for a first voltage from a first region to be provided to a circuit or another component in a second region and for a second voltage from the second region to be provided to a circuit or another component in the first region with reduced layout area.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative and should not be construed as limiting the appended claims to any particular embodiment or group of embodiments. Thus, while various embodiments of the disclosure have been described in particular detail, it should also be appreciated that numerous modifications and alternative embodiments may be devised by those having ordinary skill in the art without departing from the broader and intended spirit and scope of the present disclosure as set forth in the claims that follow. Accordingly, the specification and drawings are to be regarded in an illustrative manner and are not intended to limit the scope of the appended claims.

What is claimed is:

1. An apparatus comprising:
    a first conductive structure extending along a first dimension in a first region, wherein the first conductive structure includes a first extension extending along a second dimension into a second region and a first recess extending along the second dimension, wherein the first conductive structure is configured to provide a first voltage; and
    a second conductive structure extending along the first dimension in the second region, wherein the second conductive structure includes a second extension extending along the second dimension into the first region, the first recess of the first conductive structure configured to accept the second extension, wherein the second conductive structure further includes a second recess configured to accept the first extension of the first conductive structure, wherein the second conductive structure is configured to provide the first voltage when activated and wherein the second conductive structure is activated by a power gating transistor.

2. The apparatus of claim 1, wherein at least one of the first conductive structure or the second conductive structure includes aluminum.

3. An apparatus comprising:
    a first conductive structure extending along a first dimension in a first region, wherein the first conductive structure includes a first extension extending along a second dimension into a second region and a first recess extending along the second dimension, wherein the first conductive structure is configured to provide a first voltage;
    a second conductive structure extending along the first dimension in the second region wherein the second conductive structure includes a second extension extending along the second dimension into the first region, the first recess of the first conductive structure configured to accept the second extension, wherein the second conductive structure further includes a second recess configured to accept the first extension of the first conductive structure, wherein the second conductive structure is configured to provide the first voltage when activated;
    a third conductive structure extending along the first dimension in the first region; and
    a first via configured to couple the third conductive structure to the second extension of the second conductive structure.

4. The apparatus of claim 3, further comprising:
    a fourth conductive structure extending along the first dimension in the second region; and
    a second via configured to couple the fourth conductive structure to the first extension of the first conductive structure.

5. The apparatus of claim 4, wherein the third conductive structure includes a third extension coupled to a first circuit in the first region and the fourth conductive structure includes a fourth extension coupled to a second circuit in the second region.

6. The apparatus of claim 5, wherein the first circuit mirrors the second circuit.

7. The apparatus of claim 4, wherein the first conductive structure and the second conductive structure are included in a first wiring layer and the third conductive structure and the fourth conductive structure are included in a second wiring layer.

8. An apparatus comprising:
a first conductive structure extending along a first dimension in a first region, wherein the first conductive structure includes a first extension extending along a second dimension to a first circuit in the first region, wherein the first conductive structure is configured to provide to the first circuit a first voltage from a second region when activated; and
a second conductive structure extending along the first dimension in the second region, wherein the second conductive structure includes a second extension extending along the second dimension to a second circuit in the second region, wherein the second conductive structure is configured to provide the second circuit the first voltage from the first region.

9. The apparatus of claim 8, wherein the first circuit mirrors the second circuit.

10. The apparatus of claim 8, wherein at least one of the first conductive structure or the second conductive structure includes tungsten (W).

11. The apparatus of claim 8, further comprising:
a third conductive structure extending along the first dimension in the second region, wherein the third conductive structure includes a third extension extending along the second dimension into the first region, wherein the third conductive structure is configured to provide the first voltage from the second region when activated; and
a first via configured to couple the third extension to the first conductive structure.

12. The apparatus of claim 11, further comprising:
a fourth conductive structure extending along the first dimension in the first region, wherein the fourth conductive structure includes a fourth extension extending along the second dimension into the second region, wherein the fourth conductive structure is configured to provide the first voltage from the first region; and
a second via configured to couple the fourth extension to the second conductive structure.

13. The apparatus of claim 12, wherein the fourth conductive structure includes a first recess extending along the second dimension, wherein the first recess is configured to accept the third extension of the third conductive structure and the third conductive structure includes a second recess extending along the second dimension, wherein the second recess is configured to accept the fourth extension of the fourth conductive structure.

14. An apparatus comprising:
a first conductive structure extending along a first dimension in a first region, wherein the first conductive structure includes a first extension extending along a second dimension into a second region, wherein the first conductive structure is configured to provide a first voltage;
a second conductive structure extending along the first dimension in the second region, wherein the second conductive structure includes a second extension extending along the second dimension to a circuit in the second region; and
a via in the second region coupling the second conductive structure to the first extension of the first conductive structure such that the circuit receives the first voltage.

15. The apparatus of claim 14, further comprising:
a third conductive structure extending along the first dimension in the second region, wherein the third conductive structure includes a third extension extending along the second dimension into the first region, wherein the third conductive structure is configured to provide the first voltage when activated;
a fourth conductive structure extending along the first dimension in the first region, wherein the fourth conductive structure includes a fourth extension extending along the second dimension to a second circuit in the first region; and
a second via in the first region coupling the fourth conductive structure to the third extension of the third conductive structure such that the circuit receives the first voltage when activated.

16. The apparatus of claim 15, wherein the first conductive structure includes a first recess configured to accept the third extension of the third conductive structure and the third conductive structure includes a second recess configured to accept the first extension of the first conductive structure.

17. The apparatus of claim 14, further comprising a power rail, wherein the power rail includes the first conductive structure, the second conductive structure, and the via.

18. The apparatus of claim 14, further comprising a memory array, wherein the first conductive structure, the second conductive structure, and the via are located in a peripheral region adjacent to the memory array.

19. The apparatus of claim 14, wherein the via includes tungsten.

* * * * *